(12) United States Patent
Har et al.

(10) Patent No.: US 6,310,563 B1
(45) Date of Patent: Oct. 30, 2001

(54) METHOD AND APPARATUS FOR ENHANCED DECOMPRESSOR PARSING

(75) Inventors: David Har, Briarcliff Manor, NY (US); Charles O. Schulz, Ridgefield, CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/569,558

(22) Filed: May 12, 2000

(51) Int. Cl.[7] .................................................. H03M 7/00

(52) U.S. Cl. ................................................ 341/50; 341/67

(58) Field of Search .................................. 341/50, 51, 67

(56) References Cited

U.S. PATENT DOCUMENTS

| | | | |
|---|---|---|---|
| 5,325,091 | * | 6/1994 | Kaplan et al. ........................ 341/51 |
| 5,572,206 | * | 11/1996 | Miller et al. ........................ 341/51 |
| 5,608,396 | | 3/1997 | Cheng et al. ........................ 341/51 |
| 5,729,228 | | 3/1998 | Franaszek et al. ................... 341/51 |
| 6,037,983 | * | 3/2000 | Forbes ............................... 341/51 |

* cited by examiner

*Primary Examiner*—Trong Phan
(74) *Attorney, Agent, or Firm*—Scully, Scott, Murphy & Presser; Robert P. Tassinari, Esq.

(57) ABSTRACT

In a high-speed computer system using multiple compression and decompression engines, a method and apparatus for coding and parsing compressed data in the decompressor in order to avoid bottlenecks within the decompressor that prevent it from achieving optimum latency and throughput acceptable to the system processor.

46 Claims, 3 Drawing Sheets

METHOD AND APPARATUS FOR ENHANCED DECOMPRESSOR PARSING

BACKGROUND OF THE INVENTION

1. Field of the Invention

This invention relates generally to data compression systems, and more specifically to an improved method and apparatus for coding and parsing compressed data for the purpose of avoiding system bottlenecks that prevent optimum throughput.

2. Discussion of the Prior Art

Data compression has become increasingly vital in today's computer systems due to the high demand for data transmission and storage capacity. In particular, main memory compression is now both feasible and desirable with the advent of parallel compression using a cooperative dictionary, as described in commonly-owned U.S. Pat. No. 5,729,228 to Franaszek et al. entitled PARALLEL COMPRESSION AND DECOMPRESSION USING A COOPERATIVE DICTIONARY, incorporated herein by reference. Parallel compression is a relatively new art in the field of compression. Its main concept is to divide a block of uncompressed data into multiple sectors and then assign them to individual engines for both compression and decompression with all engines sharing a cooperative dictionary such that the compression ratio is close to that of a single-engine design. This results in much better latency and throughput than the previous single-engine designs, thus making main memory compression feasible.

Nevertheless, significant improvements are still needed, particularly in the decompression process, in order to keep pace with the rapid acceleration in today's processor speed. In particular, a processor cannot tolerate high latency or low throughput while accessing data from the main memory through the decompressor. In the past, main memory decompression has often been limited in throughput performance primarily due to the critical timing paths within its decompressor's parser. The main function of the decompressor parser is to extract consecutive data phrases from the incoming compressed data stream. These phrases comprise a certain predetermined combinations of raw characters and variable-length strings. They will eventually be decoded into uncompressed data bytes in the latter stages of the decompressor. The parser must be able to parse phrases quickly so as to sustain the decompression engine pipeline. Specifically, referring to FIG. 2, within each clock cycle, the parser utilizes an address pointer to extract a new phrase from the parser data input register, determines its type and bit length, and then calculates the address pointer for the next phrase. This process is quite cumbersome and usually results in critical paths running through multiple logic levels within the barrel shifters, adders, encoders and multiplexers. As a result, it limits the highest decompression clock rate for a given technology and compression algorithm.

It would thus be highly desirable to provide an enhanced method and apparatus which will improve the latency and throughput of the decompressor by simplifying the compression algorithm and its parsing mechanism, without sacrificing the overall compression ratio.

Moreover, it is the case that the entire decompression process is controlled by a state machine having a certain number of states. These states transition from one to another in order to initiate or terminate various steps within the decompression pipeline. They keep all decompression engines in a parallel configuration running synchronously to one another. Once the decompression process is initiated, any stall originated from the decompressor's input interface, any particular internal engine, or its output interface will also stall the entire pipeline for all engines. Thus, any stall downstream to the parser will also immediately stop the parser from parsing. This would degrade the overall decompressor's throughput performance. For example, if a cache controller is not ready to receive additional decompressed data, it will stop requesting for data. This will in turn stall the entire decompressor's pipeline.

It would thus be additionally desirable to provide a method and apparatus which will improve the latency and throughput of the decompressor by isolating the operation of the parser stage in such a manner that a subsequent downstream stall will not stall the parser operation.

SUMMARY OF THE INVENTION

It is an object of the present invention to provide a method and apparatus for reducing and eliminating a operation bottleneck created by decompressor operations due to its engines' parser devices.

It is a further object of the invention to provide a method and apparatus for reducing and eliminating a operation bottleneck created by decompressor operations due to its engines' parser devices by employing a compression algorithm whose coding scheme generates an optimal set of coded phrases comprising characters, strings and combinations thereof, to facilitate simpler and faster parsing without sacrificing good compression ratio.

It is a further object of the invention to provide a tokenizer device in between a parser device and its corresponding decompressor engine, that provides isolation of the parser and prevents any downstream stall occurring in the corresponding decompressor engine from stalling parser operation.

It is a further object of the invention to provide an enhanced parser device that is provisioned to match and sustain the bandwidth of the decompressor output by selecting an optimum set of compressed data "phrases" that meets certain performance enhancement criteria and prevents decompressor stalls that may be caused by the parser.

According to the invention, there is provided a data decompression system and methodology for decompressing information units received in compressed form, the data decompression system comprising: a parser device for extracting consecutive data phrases of compressed information units at a parser device engine rate, each data phrase comprising one of a predetermined set of characters, compressed strings or combinations thereof; a tokenizer device associated with the parser device for receiving the data phrases and converting each data phrase into fixed bit-length tokens of shortened bit-length, each token including an indicator for identifying its corresponding phrase as comprising one of a raw character or a string; and, a decompression engine for receiving the tokens and generating corresponding uncompressed information units for output thereof at a predetermined data bus rate, whereby the parser device, tokenizer device and decompression engine operate at engine rates equal to or greater than the predetermined data bus rate for maximizing decompression throughput and reducing decompression time.

Advantageously, such a method and system implementing a tokenizer between the parser device and its corresponding decompressor engine, enables the parser to concentrate parsing a much smaller set of high-level phrases which simplifies parser logic greatly and help tighten cell placement for better timing.

Furthermore, the system of the invention may be implemented in any type of compressed data transmission, storage and retrieval systems.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENT

Figure 1:
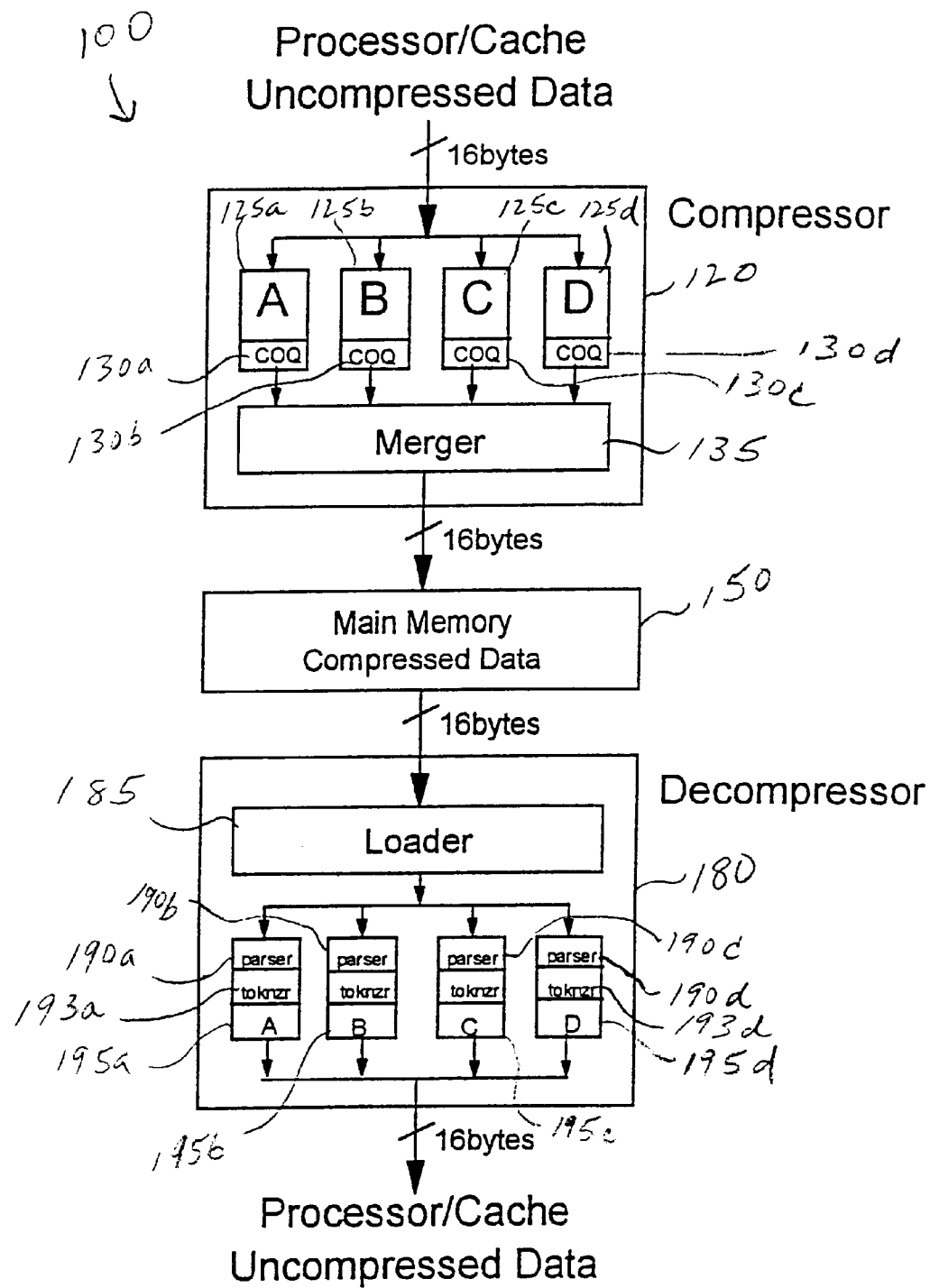
FIG. 1 illustrates a block diagram of a computer system utilizing the said invention's hardware for parallel compression and decompression.

Referring to FIG. 1, there is depicted a block diagram of a computer system 100 shown including compressor 120, a main memory 150 and decompressor 180 components. In a conventional application, the compressor mechanism 120 converts uncompressed input data received from a processor and/or cache memory component (not shown) and stores the resulting compressed data in the main memory. Subsequently, the decompressor component 180 retrieves the compressed data and converts it back to the original uncompressed data for use in the processor/cache. In general, the compressor 120 may comprise one or more parallel, identical engines and, in the embodiment depicted in FIG. 1, it includes four parallel, identical engines indicated as compressor engines 125a,b, . . . ,d. Each block of uncompressed input data, for example, may total 1K bytes, which may be divided into four 256-byte sectors. During compression, each engine 125a,b, . . . ,d processes a different (256-byte) sector in parallel, which may and saves the resultant compressed data in its own corresponding output queue (COQ) 130a,b, . . . ,d. Preferably, in accordance with the invention, each engine 125a,b, . . . ,d works on one byte of input data per system cycle and also stores it a respective 256-byte dictionary. The four individual dictionaries together form a 1KB cooperative dictionary (not shown) which is shared by all four engines for string search. The compression results of all the engines are collected together by an output merger stage 135 implementing functionality for collecting 4-byte-wide compressed data words from each engine's COQ 130a,b, . . . ,d, and combining them into 16-byte-wide quadwords, for output to the main memory component 150. Operation of such a merger device is shown and described in commonly-owned, co-pending U.S. patent application No. 09/569,556 entitled "HIGHLY-EFFICIENT COMPRESSOR OUTPUT MECHANISM", the whole contents and disclosure of which is incorporated by reference as if fully set forth herein.

There is further depicted in FIG. 1 a decompressor mechanism 180 including an input "loader" stage 185 having functionality for retrieving the compressed data from the main memory and distributing the data to a corresponding decompressor input parsing mechanisms 190a,b, . . . ,d associated with a respective parallel decompressor engine 195a,b, . . . ,d. The parsing devices receive the incoming compressed data words before the latter are processed by the engines. The number of decompressor input parsers 190a, b, . . . ,d and corresponding engines 195a,b, . . . ,d are the same as those in the compressor. For this example, the decompressor has four engines labeled A, B, C, and D.

In a typical processing scenario, the compressor converts the uncompressed input data from the processor/cache and stores the resulting compressed data in the main memory 150. At some time later, the decompressor retrieves the compressed data and converts it back to the original uncompressed data for use in the processor/cache.

In order to the meet the latency and throughput requirement in a high-speed processor-based memory system, both the compressor and decompressor must process data bytes in parallel. In this example they each have four identical engines compressing and decompressing data simultaneously. In the compressor each engine compresses one byte per cycle and the results are collected together by the merger mechanism 150 to be written into the main memory. In the preferred embodiment, in order to meet the low latency requirement and sustain the high output data rate, each of the decompressor's four engines 195a,b, . . . ,d are double-clocked, thus, enabling each engine to decompress two bytes per engine cycle to give a total of 16 bytes per bus cycle.

Figure 2:
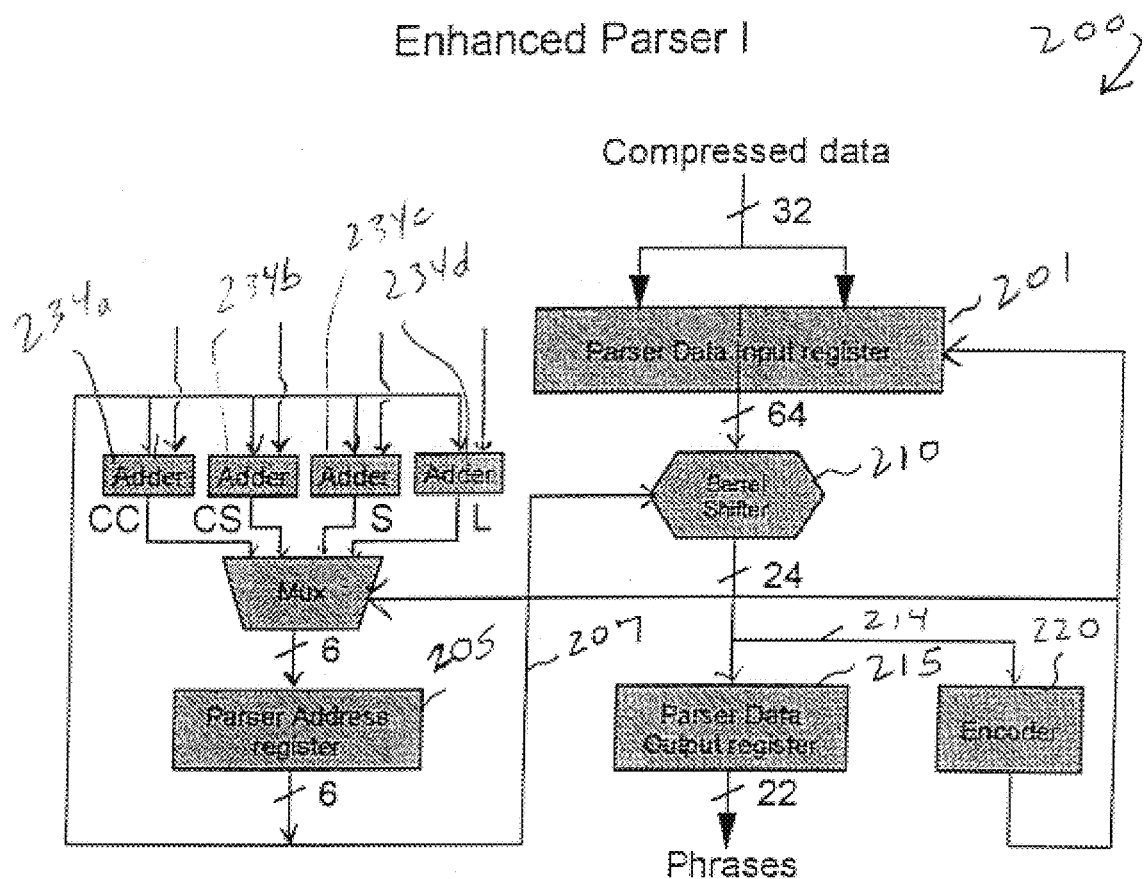
FIG. 2 illustrates a block diagram of an improved decompressor parser according to a first embodiment of the present invention.

As mentioned earlier, the bottleneck in the decompressor is usually found in its engines' parsers. FIG. 2 illustrates a block diagram of an improved decompressor's parser 200 according to a first embodiment of the present invention. As shown in FIG. 2, during decompression compressed data is first loaded into the parser's 64-bit data input register 201. A 6-bit address register 205 generates a pointer 207 that is used to point to the bit position at which the new phrase starts within the data input register. The barrel shifter 210 uses this address pointer to extract the new phrase from the data input register 201 and left-justify it before latching it into the parser data output register 215. Concurrently, via line 214, an encoder device 220 uses the new phrase to identify its type, calculate the next phrase's address, and update the data input register 201 with fresh compressed data. As known, these data paths comprise the critical paths within the parser. According to the invention, in order to increase the clock frequency of the decompressor, the number and length of the phrases that the parser has to parse per cycle need to be minimized. Four methods are now described that will enhance the parser's performance.

The first method employs a compression algorithm whose coding scheme facilitates simpler and faster parsing without sacrificing good compression ratio. The compression algorithm described in this invention is a variation of the original Lempel-Ziv algorithm, also known as LZ77 or LZ1, which was first disclosed in "A Universal Algorithm for Sequential Data Compression", IEEE Trans. on Info. Theory, IT-23(3): 337–343, 1997, the contents and disclosure of which is incorporated by reference as if fully set forth herein.

In the modified version of the LZ1 algorithm, there are two types of compression codes produced by the compressor, namely the raw character and the string. They are differentiated by a single bit flag as shown in Table 1.

TABLE 1

| Code Type | Code Definition |
|---|---|
| Raw Character | {'0', character} |
| String | {'1', primary length field, position field, secondary length field} |

During compression the compressor stores the input data bytes, $inbyte_i$, from the incoming uncompressed data stream into the dictionary in each cycle. Concurrently, it also searches for consecutive matches between the input data bytes, $inbyte_i$, and those, from $dictbyte_0$ up to $dictbyte_{i-1}$, in the dictionary. An unmatched character is an input data byte that has no matches with the dictionary. The very first byte, $inbyte_0$, of the incoming uncompressed data stream is always an unmatched character because the dictionary is empty. As more data bytes arrives, the size of the dictionary grows and more matches are possible. A single-byte matched character is an input data byte that has a match in the dictionary but its following byte does not match that of its counterpart in the dictionary, i.e. $inbyte_i$ is equal to $dictbyte_j$ but $inbyte_{i+1}$ does not equal $dictbyte_{j+1}$ for j<i. In general, an unmatched character or a single-byte matched character is known as a raw character. It is encoded into a 9-bit code consisting of a flag bit '0' followed by the character itself. For example, a raw character "00001111" is encoded into "000001111" and a raw character "11111111" is encoded into "011111111".

A matched sequence of two or more characters is known as a string of 'n' bytes, i.e. $inbyte_i=dictbyte_j$ and $inbyte_{i+n-1}=dictbyte_{j+n-1}$ for j<i and n >1. In the compressor an engine will try to find consecutive matches of data bytes between the incoming data stream and those already in the dictionary. The string found in the incoming data stream is called the working string, WS, while the one found in the dictionary is called the reference string, RS. For example, a working string of 3 bytes could start at byte 6 of the incoming data stream as, "$WS_6, WS_7, WS_8$". The corresponding reference string could be found in the dictionary as "$RS_0, RS_1, RS_2$". This working string is then encoded into a string code according to the compression algorithm. In prior art, the string code is usually consisted of a flag bit, a position field, and a length field. If the parser needs to parse all these fields in the same cycle, it would require a very wide data input register, barrel shifter and address register, etc., which would result in a slower parser operation.

Thus, according to the invention, a string is encoded into a variable-length compression code consisting of a flag bit of '1', a primary length field, a position field and a secondary length field. The primary and secondary length field, when concatenated together, form the string's length field. The advantage of splitting the length field into two parts is twofold. First of all, for strings of two or three matched characters in length, only the primary length field is needed. This shortens the bit length of the string phrase significantly. Secondly, for strings with more than three matched characters, the primary length field will be parsed first in the current cycle while the secondary length field will be parsed next in the following cycle. This is possible because the primary length field guarantees that the engine will be able to decompress a string code into two or three characters. There is no need to utilize the secondary length field until the following cycle. Thus, by splitting the length field in two, the parser will be able run faster with the shortened string code.

There is now provided a detailed description of the string's length field implemented according to the invention.

Specifically, the length field encodes the number of characters in the working string using the canonical Huffman coding scheme.

Referring to the U.S. Pat. No. 5,608,396, the contents and disclosure of which is incorporated by reference herein, mention is made of a study conducted by the patentee Joe-Ming Cheng on match length statistics using a test suite consisting of databases, programs, object code, system code, and documents in two languages from major applications on VM, MVS, RS6000, and PC. It was found that for a maximal match length of 286 bytes, the match length distribution is Laplacian from 2 till about 27. In other words, a string of 2 bytes is most common in a given block of data and the probability diminishes geometrically from a string of 2 bytes to a string of 27 bytes. Then it appears to be flat afterwards, i.e. the probability for a string of 28 bytes is about the same as that for a string of 286. Using these results as a basis, the string length coding scheme of the present invention is derived.

As shown in the Table 2, there are five cases of string length codes. The first four cases represent the Laplacian probability distribution. The more probable the string lengths are, as in the cases of 2 and 3, the less bits the length field will have. The less probable the string lengths are, as in the cases of 16 to 31, the more bits the length field will have. The fifth case of the string length codes represents uniform probability distribution. Thus, for string lengths of 32 up to 255, the number of length field bits are equal, i.e. uniform.

Specifically, since a string of 2 or 3 bytes is most probable, it is advantageous to encode these lengths with the fewest bits so as to produce the best compression ratio possible. Referring to the primary length field of case 0 in Table 2 below, the variable, 'L', can have a value of '0' or '1'. Thus, a string of 2 or 3 bytes includes a primary length field encoded as "00" and "01" respectively. Similarly, for string lengths of 4 to 7, these are still highly probable and the length fields are encoded with only four bits, "10LL", where 'LL' is "00" to "11" or "1000" to "1011" respectively.

In summary, referring to Table 2 below, a string of 2 bytes consists of only a flag bit, a primary length field of "00", and a position field. The total number of primary length field bits is 2. As will be described with reference to Tables 3 and 4, the total number of bits that comprise the position field for a string of 2 bytes may vary from 2 to 10. Therefore, the total number of string code bits may vary from 5 to 13, which are the sum of the flag bit, the length field bits and the position field bits. A string of 255 bytes consists of a flag, a primary length field of "11", a position field, and a secondary length field of "1111111111". Case 4's secondary length code cannot be a value from 00000000 to 00011111 because these string lengths are covered by the other four cases. Otherwise, an error will be generated by the parser.

TABLE 2

| Case | Primary Length Code | Secondary Length Code | Number of Bytes in the String | Total Length Bits | Total String Bits |
|---|---|---|---|---|---|
| 0 | 0L | -none- | 2–3 (L=0,1) | 2 | <5–13> |
| 1 | 10 | LL | 4–7 (LL=00,01,10,11) | 4 | <7–15> |
| 2 | 11 | 0LLL | 8–15 (LLL=000, . . . , 111) | 6 | <9–17> |
| 3 | 11 | 10LLLL | 16–31 (LLLL=0000, . . . , 1111) | 8 | <11–14> |

TABLE 2-continued

| Case | Primary Length Code | Secondary Length Code | Number of Bytes in the String | Total Length Bits | Total String Bits |
|---|---|---|---|---|---|
| 4 | 11 | 11LLLLLLLL | 32–255 (LLLLLLLL=00100000, . . . , 11111111) | 12 | <15–23> |

The position field encodes the starting address of the reference string in the dictionary to which the starting position of the working string refers. The position field comprises two parts: 1) the dictionary set; and, 2) a variable-width sector address. As previously mentioned, given a 1K-byte block of uncompressed data, it is divided into four 256-byte sectors which are stored in the respective dictionaries in the four engines. These 256-byte dictionaries form a 1K-byte cooperative dictionary, accessible by each engine. To address a reference string in one of the engines' dictionary, two bits, called the dictionary set, are used.

Table 3 shows the dictionary set coding. If a string is found in Engine A's dictionary, then the dictionary set bits are "00". If it is found in Engine B's dictionary, then the dictionary set bits are "01" etc.

TABLE 3

| Dictionary Set | Dictionary Partition Name |
|---|---|
| "00" | Engine A dictionary partition |
| "01" | Engine B dictionary partition |
| "10" | Engine C dictionary partition |
| "11" | Engine D dictionary partition |

For a working string that resides near the beginning of the incoming data stream, the possible starting addresses of the corresponding reference string in the dictionary are fewer and, therefore, it needs less bits to encode. Referring to Table 4 below, a working string cannot have a starting address of 0 because byte 0 is the first character of a sector and is always a raw character. It also cannot have a starting address of 255 because byte 255 is the last character of the sector. If a working string starts at address 1, then its corresponding reference string can only have a default starting address of '0' in one of the four dictionaries. Thus, this working string's address field can be encoded using just the dictionary set bits, 'DD'. In other words, the position field of this string is only two bits wide, namely 'DD', where 'DD' specifies one of the four dictionaries. If a working string starts at address 2, then its corresponding reference string can have a starting address of '0' or '1' in each dictionary. Thus, besides the two dictionary set bits, this working string also needs a single address bit, A, to point to the head of the reference string. If a working string starts at address 129, then its corresponding reference string can have a starting address from '0' to '128' in each dictionary. Thus, besides the two dictionary set bits, this working string also needs eight address bits, AAAAAAAA, to point to the head of the reference string. If the starting address of the reference string is 128, then the sector address bits are "10000000".

TABLE 4

| Starting Position of Working String | Dictionary Set Bits | Partition Address Bits | Total Position Bits |
|---|---|---|---|
| 0 or 255 | none | none | none |
| 1 | DD=<00–11> | none | 2 |
| 2 | DD=<00–11> | A=<0,1> | 3 |
| 3–4 | DD=<00–11> | AA==<00–11> | 4 |
| 5–8 | DD=<00–11> | AAA=<000–111> | 5 |
| 9–16 | DD=<00–11> | AAAA=<0000–1111> | 6 |
| 17–32 | DD=<00–11> | AAAAA=<00000–11111> | 7 |
| 33–64 | DD=<00–11> | AAAAAA=<000000–111111> | 8 |
| 65–128 | DD=<00–11> | AAAAAAA=<0000000–1111111> | 9 |
| 129–254 | DD=<00–11> | AAAAAAAA=<00000000–11111101> | 10 |

According to the invention, the second method for enhancing decompression parser performance is to reduce its function to just parsing for new phrases. As shown in FIG. 1, a pipeline stage, called the tokenizer 193a, . . . ,d, has been added to each respective decompressor engine 195a, b, . . . ,d to isolate each parser respective 190a,b, . . . ,d from subsequent decompression steps, as will be explained. In other words, the parser can just concentrate on parsing for new phrases without needing to know which bytes the engine is currently decompressing. Thus, its logic will become simpler and faster.

Thus, the main function of the tokenizer 193a, . . . ,d is to convert the phrases produced by the parser into 12-bit-wide tokens. There are two types of tokens, namely character tokens and position tokens. A raw character in a phrase will be converted into a character token. A string in a phrase will be converted into consecutive position tokens based on the string position and length fields. As shown in Table 5 below, the character token is consisted of a flag of '0', followed by three (3) zero's and a raw character (8 bits). For example, a character token of "000011111111" will be decompressed into the raw character, 0xFF.

The position token is consisted of a flag of '1' following by a pointer ID bit, 'I', and a ten-bit position field, 'PPPP-PPPPPP'. The pointer ID bit is used by the engine to distinguish back-to-back tokens from different strings. Thus, a pointer ID bit 'I' will have a value of zero (0) to indicate a different token and when alternates in value from 0 to 1 for indicating consecutive strings. The position field is used by the engine as an index to locate the decompressed data byte from either the dictionary or some holding register.

As an example, a working string of two (2) bytes that matches with a reference string starting at dictionary location PPPPPPPPPP can be encoded as a string phrase of "100PPPPPPPPPP", in accordance with the first embodiment of the invention which has a code type of '1' and a primary length field of "00". This will be converted by the tokenizer into two position tokens with position fields "PPPPPPPPPP" and "PPPPPPPPPP+1". In another example, a working string of 4 bytes that matches with a reference string starting at dictionary location PPPPPPPPPP can be encoded as a string phrase of "110PPPPPPPPPP00", which has a flag of '1', a primary length field of "10" and a secondary length field of "00". This is then converted by the tokenizer into four position tokens with position fields "PPPPPPPPPP", "PPPPPPPPPP+1", "PPPPPPPPPP+2" and "PPPPPPPPPP+3".

TABLE 5

| Token Type | Token Definition |
| --- | --- |
| Character | 0000CCCCCCCC |
| Position | 1IPPPPPPPPPP |

Each tokenizer device 193a, . . . ,d is additionally provided with a queue (not shown) for temporarily holding its generated tokens in between the tokenizer and the decompressor's engine thus, isolating the parser from downstream decompression operations. Preferably, this queue is deep enough to hold sixteen (16) tokens, but queues of other lengths may be implemented. Therefor, the occurrence of a downstream stall will not stall the parser or the tokenizer as long as the tokenizer's queue is not full. The parser and tokenizer may thus keep on operating until that queue is full. Additionally, by using the tokenizer to generate the larger number of low-level character and position tokens, the parser may just concentrate parsing the much smaller set of high-level phrases. This simplifies its logic greatly and helps tighten cell placement for better timing.

According to the invention, the third method for enhancing decompression parser performance is to select an optimum set of compressed data "phrases" that will meet the following three criteria:

1) Each phrase should be able to be converted into two or more tokens per cycle. This criteria will guarantee that there is no stall in the decompressor caused by the parser which may occur if a parser device parses out a phrase that does not match and sustain the bandwidth of the decompressor output data bus rate.

For instance, assuming a decompressor output data bus of sixteen (16) bytes per bus cycle, the four decompressor engines run at twice the frequency of the output data bus and each of them must decompress two (2) bytes per decompressor engine cycle. Thus, whenever the parser parses out a phrase consisting of two or more tokens, the two-tokens-per-cycle-per-engine bandwidth will be sustained. However, when the parser parses out a phrase consisting of a single raw character token, a potential stall could occur if the tokenizer runs out of tokens in its queue. This stall will prevent the decompressor from outputing data for one cycle and parser output phrases meeting this first criteria will eliminate this possibility.

2) Each phrase should be of minimum length. Since the longer the phrases are, the wider the barrel shifter, address register and adders of the parser will be. By minimizing the phrase length, these hardware will also decrease in width accordingly. This will speed up the cycle time since the processing will require fewer logic levels between registers. This criteria also implies that a phrase must not contain more than one string since a string, by definition, contains two or more tokens.

3) The number of different types of phrases should be kept to a minimum so that the parser will not grow in size and complexity.

Table 6 provides a complete set of phrases that meets the three criteria mentioned above. In Table 6, a phrase with two raw characters is called "CC". A phrase with one raw character followed by a two-byte string is called CS2. It does not require a secondary length field. However, a string with 4 or more bytes, called SX, does require a secondary length field, called L, which is parsed in the following cycle decompressor engine cycle.

As shown in Table 6, the longest phrase length CSX is 22 bits, which represents a character and a string with X bytes, where X is 2, 3, . . . ,n. This requires a 64-bit data input register, a 24-bit barrel shifter and a 6-bit address register as shown in FIG. 2. During decompression, incoming compressed data is first loaded into the 64-bit data input register. Since the parser address register always points to first bit of the current data phrase found in the data input register, it is then used to select the phrase from the barrel shifter and write it into the parser data output register at the end of each cycle. Meanwhile, this current data phrase is also used to calculate the next address register value. For example, if the current data phrase is two raw characters, CC, then the address register will be incremented by 18 because each raw character is 9 bits long. The function of four adders 234a, . . . ,234d is simply to add to the current address register an appropriate increment based on the current data phrase in order to obtain the new address for the next data phrase. During each cycle all four adders will perform the addition operation based on their specific increment in parallel, the parser will use the current phrase to select which adder's output will be actually written into the parser address register.

TABLE 6

| Case | Name | Phrase Definition | Phrase Length | # of Tokens |
| --- | --- | --- | --- | --- |
| 0 | CC | two raw characters | 18 bits | 2 |
| 1 | CS2 | a character and a 2-byte string | <23 bits | 3 |
| 2 | CS3 | a character and a 3-byte string | <23 bits | 4 |
| 3 | CSX | a character and a string with n bytes, n>3 | <23 bits | 3 |
| 4 | L | secondary length field | 2,4,6, or 10 bits | n − 2 |
| 5 | S2 | a 2-byte string | <14 bits | 2 |
| 6 | S3 | a 3-byte string | <14 bits | 3 |
| 7 | SX | a string with n bytes, n>3 | <14 bits | 2 |

It should be understood that, given the three criteria used in deriving an optimum set of phrases, both the compressor and decompressor process data according to that set of phrases. In other words the compressor engines compress data into a stream of consecutive phrases based on that set while the decompressor engine parses the same set of phrases from the input stream. Specifically, as shown in FIG.

2, the parser 200 includes a phase encoder 220 that examines the left-justified parsed data bits in the barrel shifter. Based on the bit values at the pre-determined locations in the barrel shifter 210, the encoder is able to derive the type of the phrase encountered. It then updates the parser address register 205 to locate the start of the next phrase. Any coding error will lead to wrong phrases and an error will be reported.

According to the invention, the fourth method for enhancing decompression parser performance is to further reduce the number of different types of phrases from eight (as in the third embodiment (Table 6) to four.

Figure 3:
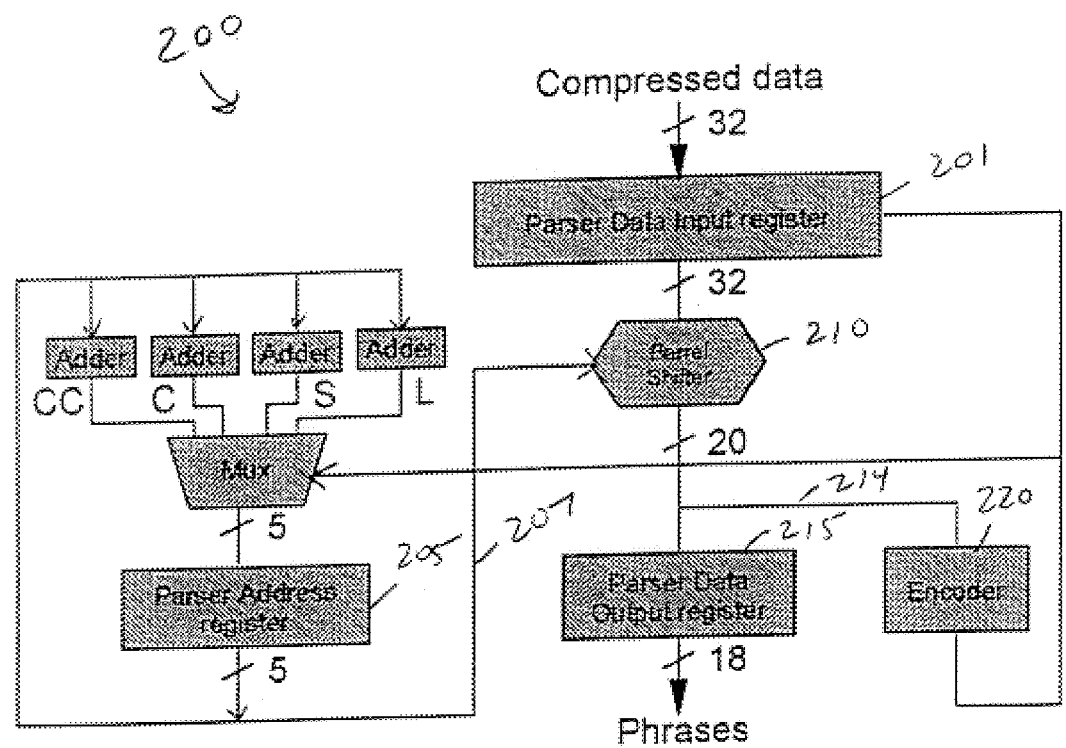
FIG. 3 illustrates a block diagram of an improved decompressor parser according to a second embodiment of the present invention.

As provided in Table 7, there are only four phrases each with a maximum total bit length of 18. Limiting the phrase type to those found in Table 7 would require a significantly more efficient parser that is less complex, requiring only a 32-bit data input register, a 20-bit barrel shifter and a 5-bit address register such as the parser configuration 300 illustrated in FIG. 3. Thus, with the reduction of logic, the parser will be able to run at a higher clock frequency than before.

TABLE 7

| Case | Name | Phrase Definition | Phrase Length | # of Tokens |
|---|---|---|---|---|
| 0 | CC | two raw characters | 18 bits | 2 |
| 1 | C | one raw character | 9 bits | 1 |
| 2 | S | a string with primary length | <14 bits | 2 |
| 3 | L | a string's secondary length | 2,4,6 or 10 bits | n − 2 |

It should be understood that the single raw character phrase, C, may introduce a stall cycle in the decompressor because it provides only one token per cycle. However, since it is always followed by the string phrase, it will not cause back-to-back stall cycles. This single-cycle stall problem however, has been minimized by adding a sixteen-token-deep queue in the tokenizer. This queue serves as a buffer to store up extra tokens, thus masking the parser stall cycles that could occur during the data output period.

It should be understood that the parser and tokenizer devices described herein operate at the precise same cycle rate (frequency) as the decompression engine cycle. However, these devices may be either 1× or 2× the frequency of the decompressor's bus cycle. In one implementation, the decompressor's input and output data interfaces are 16 bytes wide, for example, and run at a 133 Mhz bus cycle, for example. However, the decompressor's engines may run either at 133 Mhz or 266 Mhz, for example. Since there are four engines and each decompresses 2 bytes per cycle concurrently, a total of 8 bytes are decompressed per decompressor cycle. If the decompressor is running at 1× bus clock speed, then it may output 16 bytes of uncompressed data every other bus cycle. If it is running at 2× bus clock speed, then it matches the bus bandwidth and output 16 bytes every bus cycle. The decompressor thus, no longer degrades the throughput of the overall memory system. Thus, by minimizing the critical paths within the parser in accordance with the principles of the invention, the decompressor is enabled to run at 2× bus clock speed, and, therefore, allows the decompressor engine cycle to be half of the bus cycle.

The use of the tokenizer not only enhances the operability of the parser but also reduces decompression time. Specifically, it offloads some logic from the parser and allows the parser to run at 2× bus cycle speed. This in turns improves the throughput of the decompression pipeline and thus reduces the overall decompression time for single and multiple parallel implemented compression/decompression systems. Without the tokenizer the parser would have to run at 1× bus cycle speed which would lower the output bandwidth.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A data compression/decompression system comprising:
a compression engine for receiving uncompressed information units comprising raw characters and working strings and compressing them into compressed information units, said compressor engine having an associated dictionary table including entries comprising raw characters and reference strings, each reference string representing matched sequence of two or more bytes of data from an input working string; and,
a decompression engine for receiving compressed information units and generating said uncompressed information units in decompression engine cycles, said decompression engine including a parser device for extracting consecutive data phrases of compressed information units, each data phrase comprising one of a predetermined set of characters, compressed strings or combinations thereof,
wherein a data phrase includes a variable bit-length compression code for representing a matched sequence of bytes defining a compressed string, each variable bit-length compression code including a primary length field and a secondary length field for defining a string's length, and a position length field for encoding a starting address of the reference string in said dictionary to which a starting position of a working string refers, said parser device parsing said primary length fields and secondary length fields in different decompression engine cycles to enhance parser device throughput.

2. The data compression/decompression system as claimed in claim 1, wherein for statistically probable matching strings comprising up to three bytes, said secondary length field is unused and said primary length field comprises data of minimum bit length, thereby enabling said parser to process said data phrase in a single decompression engine cycle.

3. The data compression/decompression system as claimed in claim 2, wherein said minimum bit length comprises a total of two bits for identifying a string length.

4. The data compression/decompression system as claimed in claim 3, wherein a data phrase includes a fixed bit-length compression code for representing a single byte character, said parser differentiating a data phrase of compressed character type or compressed string type by a single flag bit.

5. The data compression/decompression system as claimed in claim 4, wherein said position length field comprises a first dictionary set field representing a dictionary in an engine where said reference string for said data phrase is found and a variable-width sector address field representing said starting address of the reference string in said dictionary.

6. The data compression/decompression system as claimed in claim 5, wherein for matching strings of up to 256 bytes in length, said position length field comprises a range from 2 to 10 bits.

7. The data compression/decompression system as claimed in claim 1, wherein for statistically probable matching strings comprising up to three bytes, a corresponding data phrase for parsing ranges anywhere from 5 bits to 13 bits.

8. The data compression/decompression system as claimed in claim 2, wherein said compression engine employs Ziv-Lempel compression algorithm.

9. The data compression/decompression system as claimed in claim 2, wherein said decompression engine further comprises a tokenizer device for converting each data phrase produced by said parser into fixed-bit length tokens, said tokens including an indicator for identifying the phrase as comprising one of a raw character or a string.

10. The data compression/decompression system as claimed in claim 9, wherein said tokenizer device converts a phrase comprising a string of two or more bytes into consecutive position tokens, said position tokens based on a string position and length fields.

11. The data compression/decompression system as claimed in claim 10, wherein said position token further includes an identifier for enabling said decompression engine to distinguish between consecutive position tokens belonging to a single stream, and consecutive position tokens belonging to different streams.

12. The data compression/decompression system as claimed in claim 10, wherein said tokenizer device further comprises a queue mechanism for temporarily storing generated tokens before transferring them downstream to said decompressor engine, said tokenizer queue mechanism isolating said parser and enabling continued parser operation during occurrence of decompressor stall cycles.

13. The data compression/decompression system as claimed in claim 12, wherein each of said predetermined set of characters, compressed strings or combinations extracted by said parser optimally meet and sustain decompressor output bandwidth requirements.

14. The data compression/decompression system as claimed in claim 13, wherein a first predetermined set of data phrases includes phrases that are able to be converted into two or more tokens per decompression engine cycle.

15. The data compression/decompression system as claimed in claim 12, wherein said first optimum set of data phrases includes phrases having a maximum bit length ranging up to 23 bits.

16. The data compression/decompression system as claimed in claim 15, wherein a second optimal set of data phrases includes phrases representing two raw characters, a single raw character, a string's primary length field, and a string's secondary length field.

17. The data compression/decompression system as claimed in claim 16, wherein said second optimal set of data phrases includes phrases having a maximum bit length ranging up to 18 bits.

18. A data decompression system for decompressing information units received in compressed form, said data decompression system comprising:
  a parser device for extracting consecutive data phrases of compressed information units at a parser device engine rate, each data phrase comprising one of a predetermined set of characters, compressed strings or combinations thereof;
  a tokenizer device associated with said parser device for receiving said data phrases and converting each data phrase into fixed bit-length tokens of shortened bit-length, each token including an indicator for identifying its corresponding phrase as comprising one of a raw character or a string; and,
  a decompression engine for receiving said tokens and generating corresponding uncompressed information units for output thereof at a predetermined data bus rate, whereby said parser device, tokenizer device and decompression engine operate at engine rates equal to or greater than said predetermined data bus rate for maximizing decompression throughput and reducing decompression time.

19. The data decompression system as claimed in claim 18, further comprising a dictionary table associated with a decompression engine having entries comprising raw characters and reference strings, each reference string representing a matched sequence of two or more bytes of data, said decompression engine accessing said dictionary table for generating uncompressed information units for output thereof.

20. The data decompression system as claimed in claim 19, wherein said parser device retrieves data phrases comprising either one of compressed code type data of fixed bit-length for representing a compressed character, and a compressed code type data of variable bit-length type for representing a matched sequence of bytes for representing an incoming working string of uncompressed information units, each variable bit-length type including a primary length field and a secondary length field for defining a string's length, and a position length field for encoding a starting address of the reference string in said dictionary to which a starting position of a working string refers.

21. The data decompression system as claimed in claim 20, wherein for statistically probable matching strings comprising up to three bytes, said secondary length field is unused and said primary length field comprises data of minimum bit length thereby enabling said parser to process said data phrase in a single decompression engine cycle.

22. The data decompression system as claimed in claim 20, wherein for matching strings comprising more than three bytes, said parser device parsing said primary length fields and secondary length fields of a data phrase in different decompression engine cycles.

23. The data decompression system as claimed in claim 21, wherein said minimum bit length comprises a total of two bits for identifying said string length code.

24. The data decompression system as claimed in claim 20, wherein a data phrase of compressed code type data or compressed string code type is differentiated by said parser by a single flag bit.

25. The data decompression system as claimed in claim 24, wherein said position length field comprises a first dictionary set field representing a dictionary in an engine where said reference string for said data phrase is found and a variable-width sector address field representing said starting address of the reference string in said dictionary.

26. The data decompression system as claimed in claim 25, wherein for matching strings of up to 256 bytes in length, said position length field length total bits ranging from 2 to 10 bits.

27. The data decompression system as claimed in claim 20, wherein for statistically probable matching strings comprising up to three bytes, a corresponding data phrase for parsing ranges anywhere from 5 bits to 13 bits.

28. The data decompression system as claimed in claim 18, wherein said tokenizer device converts a phrase comprising a string of two or more bytes into consecutive position tokens, said position tokens based on a string position and length fields.

29. The data decompression system as claimed in claim 28, wherein said position token further includes an identifier for enabling said decompression engine to distinguish between consecutive position tokens belonging to a single stream, and consecutive position tokens belonging to different streams.

30. The data decompression system as claimed in claim 28, wherein said tokenizer device further comprises a queue mechanism for temporarily storing generated tokens before transferring them to said decompressor engine, said tokenizer queue mechanism isolating said parser and enabling continued parser operation during occurrence of decompressor stall cycles.

31. The data decompression system as claimed in claim 30, wherein each of said predetermined set of characters, compressed strings or combinations extracted by said parser optimally meet and sustain decompressor output bandwidth requirements.

32. The data decompression system as claimed in claim 31, wherein a first optimum set of data phrases includes phrases that are able to be converted into two or more tokens per decompression engine cycle.

33. The data decompression system as claimed in claim 32, wherein a second optimal set of data phrases includes phrases representing two raw characters, a single raw character, a string's primary length field, and a string's secondary length field.

34. A method for decompressing compressed data information units generated by a data compression engine, said method comprising the steps of:

a) parsing said compressed information units and extracting consecutive data phrases at a parsing engine rate, each data phrase comprising one of a predetermined set of characters, compressed strings or combinations thereof;

b) converting each extracted data phrase into fixed bit-length tokens of shortened bit-length, each said token including an indicator for identifying its corresponding phrase as comprising one of a compressed raw character or a compressed string;

c) implementing a decompression engine for receiving said fixed bit-length tokens; and, d) processing said tokens at a decompression engine rate for outputting corresponding uncompressed information units at a predetermined data bus rate, wherein said parsing engine rate, tokenizing rate and decompression engine rate are equal to or greater than said predetermined data bus rate for maximizing decompression throughput and reducing decompression time.

35. The method as claimed in claim 34, wherein prior to step a), the step of:

implementing a cooperative dictionary table associated with said compression engine; and, forming entries in said dictionary table comprising raw characters and reference strings, each reference string representing matched sequence of two or more bytes of data from an incoming working string of uncompressed information units to be compressed.

36. The method as claimed in claim 35, wherein a data phrase comprises either one of a compressed code type data of fixed bit-length for representing a compressed character, and a compressed code type data of variable bit-length type for representing a sequence of bytes defining a compressed string, said method including representing a string's length in each variable bit-length type as a primary length field and a secondary length field and a position length field for encoding a starting address of the reference string in said dictionary to which a starting position of a working string refers.

37. The method as claimed in claim 36, wherein said representing step comprises the steps of:

determining statistically probable matching strings comprising three bytes of less, and forming a corresponding data phrase for said strings to include a primary length field comprising data of minimum bit length and a position length field, whereby said parsing step for such statistically probable matching strings is performed in a single decompression engine cycle.

38. The method as claimed in claim 36, wherein for matching strings comprising more than three bytes, the step of forming a corresponding data phrase for said strings to include a primary length field, secondary length fields and a position length field, whereby said parsing step includes parsing said primary length fields and secondary length fields of a data phrase in different decompression engine cycles.

39. The method as claimed in claim 37, wherein said minimum bit length comprises a total of two bits for identifying said string length code.

40. The method as claimed in claim 37, further said parsing step includes: differentiating a data phrase of compressed code type data or compressed string code type according to a single flag bit.

41. The method as claimed in claim 36, wherein said converting step b) includes converting a data phrase representing a string of two or more bytes into consecutive position tokens, said position tokens based on a string position and length fields.

42. The method as claimed in claim 41, wherein said converting step b) includes providing an identifier in each token for enabling a decompression engine to distinguish between consecutive position tokens belonging to a single stream, and consecutive position tokens belonging to different streams.

43. The method as claimed in claim 42, wherein prior to step d) the step of temporarily storing generated tokens before transferring them to said decompressor engine, whereby said continued parsing steps are enabled during occurrence of a decompressor stall cycles.

44. The method as claimed in claim 43, wherein each data phrase of predetermined set of characters, compressed strings or combinations thereof optimally meet and sustain predetermined data bus rate requirements.

45. The method as claimed in claim 44, wherein a first optimum set of data phrases includes phrases that are able to be converted into two or more tokens per decompression engine cycle.

46. The method as claimed in claim 45, wherein a second optimal set of data phrases includes phrases representing two raw characters, a single raw character, a string's primary length field, and a string's secondary length field.

* * * * *